United States Patent
Bai et al.

(10) Patent No.: US 8,633,769 B2
(45) Date of Patent: Jan. 21, 2014

(54) DUAL LOOP ADAPTATION DIGITAL PREDISTORTION ARCHITECTURE FOR POWER AMPLIFIERS

(75) Inventors: Chunlong Bai, Kanata (CA); Yuxing Zhang, Ottawa (CA); Sai Mohan Kilambi, Ontario (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 13/593,693

(22) Filed: Aug. 24, 2012

(65) Prior Publication Data

US 2013/0241646 A1    Sep. 19, 2013

Related U.S. Application Data

(60) Provisional application No. 61/611,231, filed on Mar. 15, 2012, provisional application No. 61/611,372, filed on Mar. 15, 2012.

(51) Int. Cl.
 *H03F 1/26*  (2006.01)
(52) U.S. Cl.
 USPC .......................... 330/149; 330/291
(58) Field of Classification Search
 USPC ................................. 330/149, 291
 See application file for complete search history.

(56) References Cited

U.S. PATENT DOCUMENTS

| | | | |
|---|---|---|---|
| 6,731,168 B2 * | 5/2004 | Hedberg et al. | 330/149 |
| 7,071,777 B2 * | 7/2006 | McBeath et al. | 330/149 |
| 7,151,405 B2 | 12/2006 | Nezami | |
| 7,170,345 B2 * | 1/2007 | Hongo | 330/149 |
| 7,274,749 B2 | 9/2007 | Ball et al. | |
| 7,460,613 B2 * | 12/2008 | Sahlman | 375/296 |
| 7,782,979 B2 | 8/2010 | Long | |
| 8,013,676 B2 | 9/2011 | Su et al. | |
| 8,078,561 B2 * | 12/2011 | Liu et al. | 706/46 |
| 8,351,876 B2 * | 1/2013 | McCallister et al. | 455/114.3 |

* cited by examiner

Primary Examiner — Patricia Nguyen
(74) Attorney, Agent, or Firm — Coats and Bennett PLLC

(57) ABSTRACT

One or more embodiments of a method and apparatus taught herein provide a predistortion system to compensate for the non-linearity of a power amplifier. The system includes an outer predistorter, an inner predistorter, and a first adaptation circuit. The predistorter predistorts an input signal to generate a first output signal, and uses a first memory model that models power amplifier memory effects within a first range of time constants. The inner predistorter predistorts the first output signal to generate a second output signal, and uses a second memory model that models power amplifier memory effects within a second range of time constants that is greater than the first range of time constants. The second output signal is provided as an input to the power amplifier, and the first adaptation circuit adapts the outer predistorter responsive to feedback from the power amplifier.

15 Claims, 3 Drawing Sheets

DUAL LOOP ADAPTATION DIGITAL PREDISTORTION ARCHITECTURE FOR POWER AMPLIFIERS

RELATED APPLICATION

This application claims the benefit of U.S. Provisional Patent Application 61/611,231 filed Mar. 15, 2012, and also claims the benefit of U.S. Provisional Patent Application 61/611,372 filed Mar. 15, 2012, both of which are incorporated herein by reference.

BACKGROUND

The present invention generally relates to power amplifiers, and more particularly relates to methods and apparatus for compensating an input signal for distortion introduced to the input signal by a power amplifier.

The design of radio-frequency power amplifiers for communications applications often involves a trade-off between linearity and efficiency. Power amplifiers are typically most efficient when operated at or near a so-called "saturation point." However, the response of the amplifier at or near the point of saturation is non-linear. Generally speaking, when operating in the high-efficiency range, a power amplifier's response exhibits a nonlinear response and memory effects of varying duration.

One way to improve a power amplifier's efficiency and its overall linearity is to utilize a predistorter to digitally predistort the input to the power amplifier to compensate for the distortion introduced by the power amplifier. In effect, the input signal is adjusted in anticipation of the distortion to be introduced by the power amplifier, so that the output signal is largely free of distortion products.

Generally, the predistortion is applied to the signal digitally, at baseband frequencies, (i.e., before the signal is upconverted to radio frequencies). Predistortion techniques can be quite beneficial in improving the overall performance of a transmitter system, in terms of both linearity and efficiency. However, recent advances in power amplifier technology have yielded power amplifiers exhibiting more sophisticated and complex characteristics that current predistortion models are inadequate to handle.

SUMMARY

Exemplary embodiments of the invention comprise methods and apparatus for predistorting an input signal to compensate for the non-linearity of a power amplifier. In one exemplary embodiment, a predistortion system includes an outer predistorter, an inner predistorter, and a first adaptation circuit. The outer predistorter predistorts an input signal to generate a first predistorted signal, and uses a first memory model that models power amplifier memory effects within a first range of time constants. The inner predistorter predistorts the first predistorted signal to generate a second predistorted signal, and uses a second memory model that models power amplifier memory effects within a second range of time constants that is greater than the first range of time constants. The second predistorted signal is provided as an input to the power amplifier. The first adaptation circuit adapts the outer predistorter responsive to feedback from the power amplifier.

The predistortion system may also include a second adaptation circuit configured to adapt the inner predistorter responsive to feedback from the power amplifier. In one example, the outer predistorter, inner predistorter, first adaptation circuit, and second adaptation circuit are all located within a wireless terminal. In another example, each of the outer predistorter, inner predistorter, and first adaptation circuit are located within a wireless terminal, but the second adaptation circuit is external to the wireless terminal. The inner predistorter and second adaptation circuit may form an inner predistortion loop, while the outer predistorter and first adaptation circuit may form an outer predistortion loop.

The first memory model may include a polynomial-based algorithm. The second memory model may include a space-mapping adaptation algorithm. In one example, the second memory model is static or quasi-static.

A corresponding method of compensating for the non-linearity of a power amplifier predistorts an input signal using an outer predistorter that generates a first predistorted signal. The outer predistorter uses a first memory model that models power amplifier memory effects within a first range of time constants. An inner predistorter is used to predistort the first predistorted signal and generate a second predistorted signal. The inner predistorter uses a second memory model that models power amplifier memory effects within a second range of time constants that is greater than the first range of time constants. The second predistorted signal is provided as an input to a power amplifier, and the outer predistorter is adapted via a first adaptation circuit, responsive to feedback from the power amplifier.

The method may also include the step of adapting the inner predistorter via a second adaptation circuit, responsive to feedback from the power amplifier. In one example, the step of adapting the outer predistorter is performed more frequently than the step of adapting the inner predistorter. The inner predistorter and second adaptation circuit may form an inner predistortion loop, and the outer predistorter and first adaptation circuit may form an outer predistortion loop.

The first memory model may include a polynomial-based algorithm. The second memory model may include a space-mapping adaptation algorithm. In one example, the second memory model is static or quasi-static.

Of course, the present invention is not limited to the above features and advantages. Indeed, those skilled in the art will recognize additional features and advantages upon reading the following detailed description, and upon viewing the accompanying drawings.

DETAILED DESCRIPTION

Figure 1:
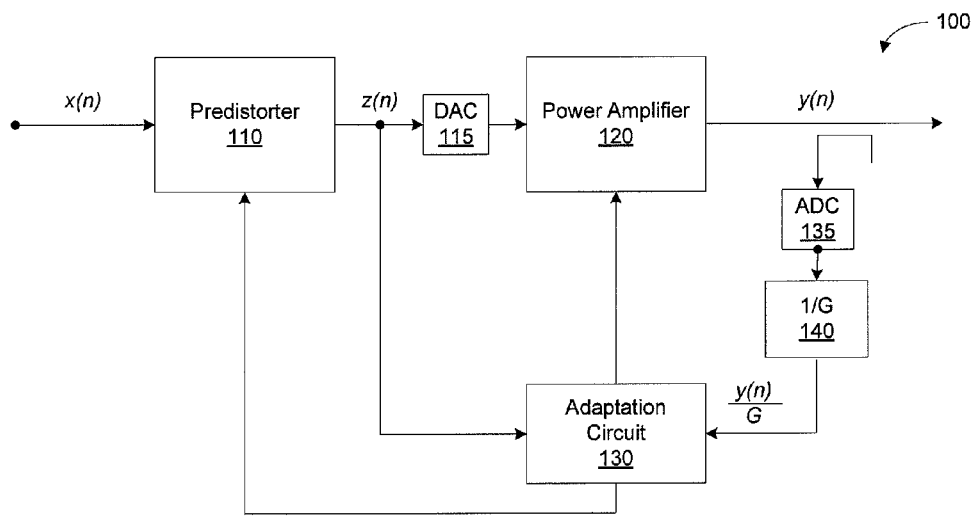
FIG. 1 illustrates an example architecture for a pre-distortion circuit.

Referring now to the drawings, FIG. 1 illustrates a conventional pre-distortion system 100 configured to compensate for distortion introduced to a communications signal by a power amplifier 120. As noted above, a power amplifier is typically most efficient when it is operated in a non-linear range. However, the non-linear response of a power amplifier causes unwanted out-of-band emissions and reduces the spectral efficiency in a communication system.

A predistorter 110 may be used to improve the efficiency and linearity of the power amplifier 120 by "pre-distorting"

the power amplifier's input signal to compensate for the non-linear distortion introduced by the power amplifier 120. The cascading of predistorter 110 and power amplifier 120 improves the linearity of the output signal, even while power amplifier 120 is operated at high efficiency. Although pre-distortion is used in the circuits and systems described herein to linearize the output of a power amplifier 120, those skilled in the art will appreciate that the techniques described herein are more generally applicable to characterizing and/or compensating for distortion caused by any type of non-linear electronic device.

As seen in the pre-distortion system 100 pictured in FIG. 1, an input signal x(n) is input to a predistorter 110. Predistorter 110 pre-distorts the input signal x(n) to compensate for the distortion introduced by power amplifier 120 when the power amplifier 120 is operated in its non-linear range. The pre-distorted input signal z(n) generated by predistorter 110 is then converted to analog form by a digital-to-analog converter 115, and applied to the input of power amplifier 120. The power amplifier 120 amplifies the pre-distorted input signal z(n) to produce an output signal y(n). If predistorter 110 is properly designed and configured, then the output signal y(n) will contain fewer distortion products and out-of-band emissions than if the power amplifier 120 were used alone.

The signal z(n) input to power amplifier 120 and a scaled version of the amplifier output signal y(n) are applied to an adaptation circuit 130 that uses a distortion model to determine coefficients for the predistorter 110. In one example, the adaptation circuit 130 may have an indirect-learning architecture in which the predistorter model's coefficients (parameters) are estimated directly from the input and outputs of power amplifier 120. In another example, the adaptation circuit 130 may have a direct-learning architecture in which a model for the power amplifier 120 is not derived, but rather, the non-linear characteristics of the power amplifier 120 are learned indirectly through the modeling of the pre-distortion necessary to counteract the distortion introduced by power amplifier 120.

The analog power amplifier output signal y(n) is converted to digital form by an analog-to-digital converter 135, and is then scaled via attenuator 140, to reflect the net linear gain G that is desired from the combination of predistorter 110 and power amplifier 120. Scaling the output signal y(n) by the inverse of G permits the non-linearities introduced by power amplifier 120 to be analyzed independently from its gain.

Power amplifiers are known to exhibit memory effects, by which the gain of a power amplifier lags its corresponding input signal by a certain amount. Such memory effects can further contribute to the already non-linear nature of power amplifiers. Additionally, recent advances in power amplifier technology, and in particular advances in the transistors used in power amplifiers, have yielded power amplifiers exhibiting more sophisticated and complex characteristics that current predistortion models are inadequate to handle.

Figure 2:
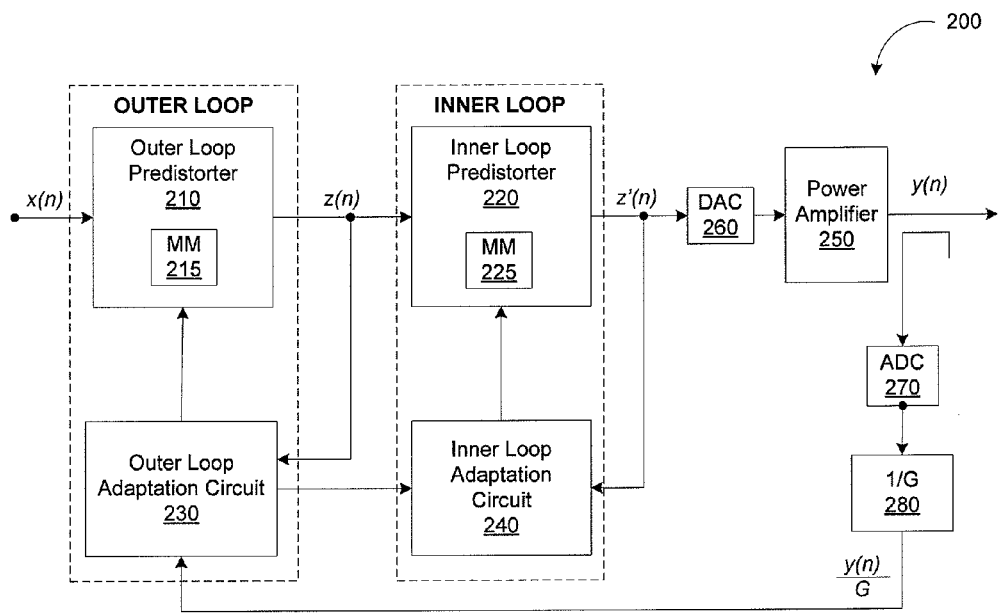
FIG. 2 illustrates a dual loop adaptation digital predistortion architecture.

FIG. 2 illustrates an improved dual loop adaptation digital predistortion system 200 architecture that is able to adequately handle more advanced power amplifiers. The pre-distortion system 200 includes an outer loop predistorter 210, an inner loop predistorter 220, an outer loop predistorter adaptation circuit 230, an inner loop predistorter adaptation circuit 240, and a power amplifier 250. The outer loop predistorter 210 predistorts input signal x(n) to generate a first predistorted signal z(n) as an output. The outer loop predistorter 210 uses a first memory model 215 that models power amplifier memory effects within a first range of time constants.

The inner predistorter 220 predistorts the first predistorted signal z(n) to generate a second predistorted signal z'(n) as an output. The inner predistorter 220 uses a second memory model 225 that models power amplifier memory effects within a second range of time constants that is greater than the first range of time constants. In one example the first range of time constants is on the order of several microseconds, and the second range of time constants is on the order of several seconds. Of course, this is only a non-limiting example, and those of ordinary skill in the art will appreciate that other ranges of time constants could be applicable.

The second predistorted signal z'(n) is converted to analog form by a digital-to-analog converter 260, and is presented as an input to the power amplifier 250. Responsive to feedback from the power amplifier 250, the outer loop adaptation circuit 230 adapts the outer loop predistorter 210.

To elaborate, the analog power amplifier output signal y(n) is converted to digital form by an analog-to-digital converter 270, and is then scaled via attenuator 280, to reflect the net linear gain G that is desired from the combination of predistorters 210, 220 and the power amplifier 250. Scaling the output signal y(n) by the inverse of G permits the non-linearities introduced by power amplifier 120 to be analyzed independently from its gain.

The output of attenuator 280 is provided to the outer loop adaptation circuit 230, which adapts the outer loop predistorter 210 by computing coefficients for the outer loop predistorter 210. The first memory model 215 is less complex than the second memory model 225, enabling the outer loop predistorter 210 to be updated more frequently than the inner predistorter 220. In one example each of the first and second memory models 215, 225 comprise respective polynomial-based algorithms. However, as polynomial-based algorithms can become quite complex for longer memory effects, the memory model 225 of the inner predistorter 220 may instead comprise a space-mapping adaptation algorithm. Space-mapping refers to an optimization technology used to provide a bridge between a coarse model (e.g., a simpler polynomial-based algorithm network) and a fine model (e.g., a neural network). In one or more embodiments, the space-mapping adaptation algorithm is based on one of the layered memory structures disclosed in U.S. Provisional Patent Application 61/611,372 filed Mar. 15, 2012, which is incorporated by reference.

The inner predistorter 220 may be static, or quasi-static. If the inner loop predistorter 220 is static, it may be configured during manufacture and may not be adapted thereafter. In this example, the coefficients of the inner predistorter 220 may be fixed at the factory based on a per-device fine calibration. Alternatively, if the inner predistorter 220 is quasi-static (i.e. adapted, but over longer time periods), then an optional inner loop adaptation circuit 240 may be included to adapt the inner loop predistorter 220 using the second memory model. The inner predistorter 220 adaptations may occur infrequently, for example at startup of a user terminal including the predistortion system 200.

The outer predistorter 210 and the outer adaptation circuit 230 collectively form an "outer loop," while the inner predistorter 220 and the optional inner loop adaptation circuit 240 collectively form an "inner loop." The outer loop is capable of modeling short term characteristics of the power amplifier 250, while the inner loop is more complex and sophisticated and models longer term characteristics of the power amplifier 250.

In one example, the outer predistorter 210, inner predistorter 220, outer loop adaptation circuit 230, and inner loop adaptation 240 circuit are all located within a wireless terminal, such as a user equipment (UE) or other wireless terminal in a wireless communication network). However, as discussed above the inner loop may be static or quasi-static. Therefore, in one or more embodiments, the inner loop adaptation circuit 240 may be external to such a wireless terminal, and may be located at a manufacturing facility, for example.

Figure 3:
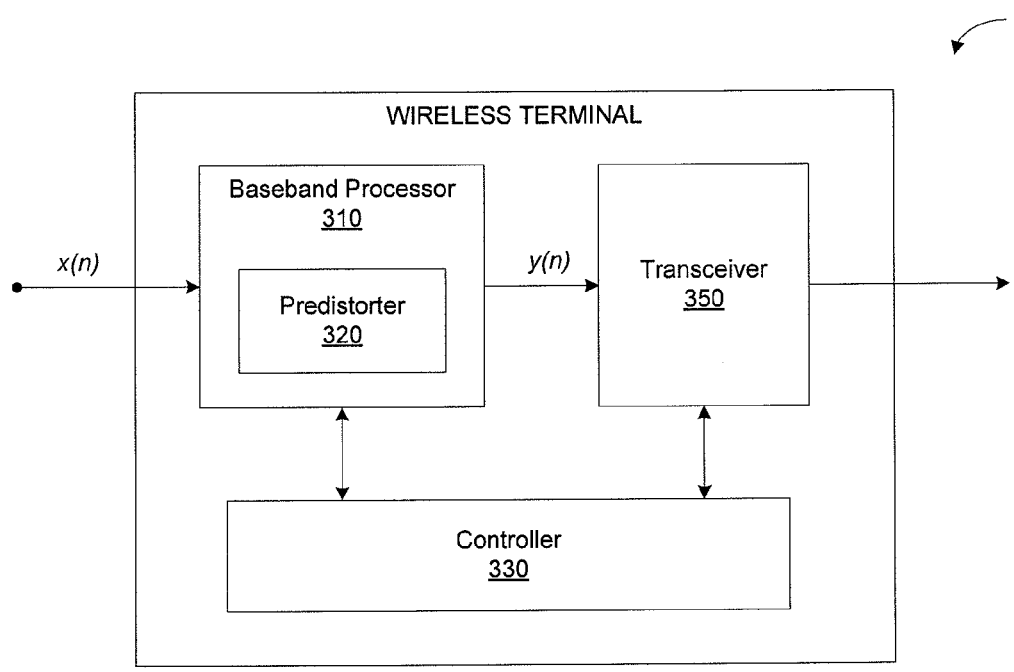
FIG. 3 illustrates an example wireless terminal implementing the architecture of FIG. 2.

FIG. 3 illustrates an example wireless terminal 300 implementing the predistortion system 200 of FIG. 2. The wireless terminal 300 includes a baseband processor 310, a controller 330, and a transceiver 350. The baseband processor 310 includes a predistorter 320 (i.e. includes both the outer loop predistorter 210 and inner loop predistorter 220), and also includes the power amplifier 250. The baseband processor outputs signal y(n) to transceiver 350 for wireless transmission to a receiving device (e.g. a base station in a wireless communication network). Controller 330 includes the outer loop adaptation circuit 230, and may optionally also include the inner loop adaptation circuit 240, to adapt the predistorter 210.

The processor 310 and controller 330 each comprise one or more processor circuits, including, for example, one or more microprocessors, microcontrollers, digital signal processors, or the like, and are also each configured with appropriate software and/or firmware to carry out one or more of the techniques discussed above.

Figure 4:
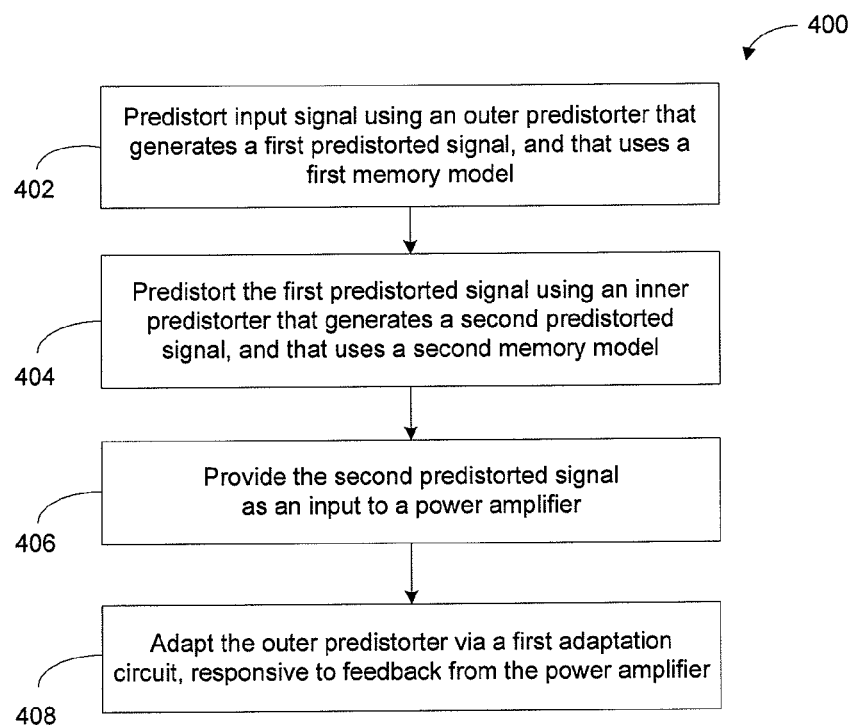
FIG. 4 illustrates a method of compensating for the non-linearity of a power amplifier.

FIG. 4 illustrates a method of compensating for the non-linearity of a power amplifier. An input signal is predistorted using an outer predistorter 210 that generates a first predistorted signal (step 402). The outer predistorter using a first memory model 215 that models power amplifier memory effects within a first range of time constants. The first predistorted signal is then predistorted using an inner predistorter 220 that generates a second predistorted signal (step 404). The inner predistorter uses a second memory model 225 that models power amplifier memory effects within a second range of time constants that is greater than the first range of time constants. For example, the first range of time constants may be on the order of several microseconds, while the second range of time constants is on the order of several seconds. The second predistorted signal is provided as an input to a power amplifier 250 (step 406), and the outer predistorter is adapted via a first adaptation circuit 230 (step 408), responsive to feedback from the power amplifier.

Figure 5:
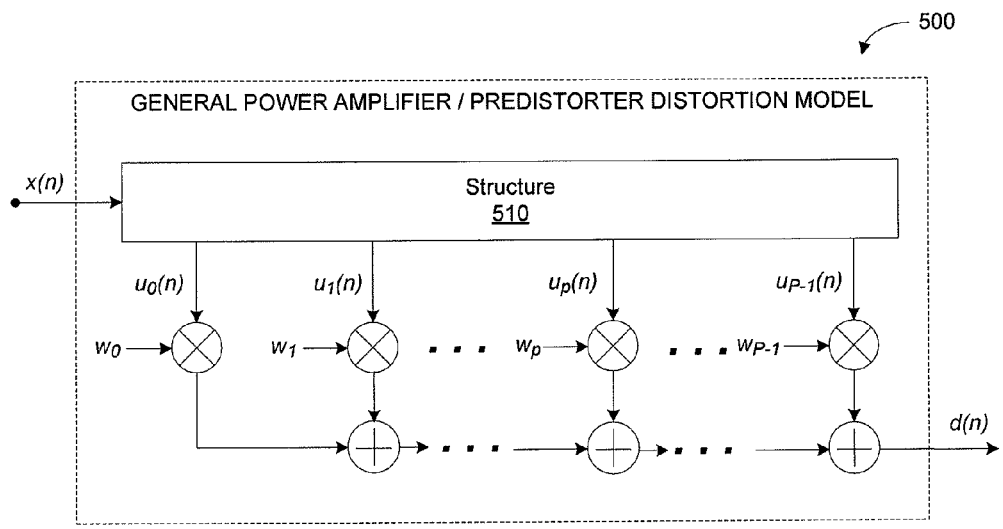
FIG. 5 illustrates an example generalized distortion model.

FIG. 5 illustrates a generalized distortion model 500, which may represent the distortion introduced by the power amplifier 250, and which may be used in the predistorters 210, 220, the adaptation circuits 230, 240, or both. The distortion model 500 comprises a structure 510 corresponding to a desired basis function set. The model structure 510 includes P taps, where each tap corresponds to a basis function. It should be noted that, in some embodiments, multiple taps may correspond to the same basis function. In general, a greater the quantity of taps P indicates a model having greater complexity. Thus, for example, the first memory model 215 may have fewer taps than the second memory model 225 (see FIG. 2).

The model structure 510 operates on the input signal x(n) to produce data signals $\{u_0(n), u_1(n), \ldots u_{P-1}(n)\}$. The distortion model 500 then computes a weighted sum of the data samples $\{u_0(n), u_1(n), \ldots u_{P-1}(n)\}$ to obtain a distorted input signal d(n). More specifically, the data samples $\{u_0(n), u_1(n), \ldots u_{P-1}(n)\}$ are multiplied by corresponding weighting coefficients $\{w_0(n), w_1(n), \ldots w_{P-1}(n)\}$, and the resulting products are added together to obtain d(n). Depending on the location of the model 500 (i.e., in a predistorter or in an adaptation circuit), the distorted input signal d(n) may correspond to an output of one of the predistorters 210, 220, or an output of one of the adaptation circuits 230, 240.

The distortion model shown in FIG. 5 can be represented by:

$$d(n) = \sum_{p=0}^{P-1} w_p u_p(n). \quad \text{Eq. 1}$$

Equation 1 can be written as a linear equation according to:

$$d(n) = u^T(n)w, \quad \text{Eq. 2}$$

where u(n) is a P×1 vector of data samples output by the structure at time n, and where w is a P×1 vector of the weighting coefficients.

Thus, the foregoing description and the accompanying drawings represent non-limiting examples of the methods and apparatus taught herein. As such, the present invention is not limited by the foregoing description and accompanying drawings. Instead, the present invention is limited only by the following claims and their legal equivalents.

What is claimed is:

1. A predistortion system to compensate for the non-linearity of a power amplifier, comprising:
   an outer predistorter to predistort an input signal and generate a first predistorted signal, wherein the outer predistorter uses a first memory model that models power amplifier memory effects within a first range of time constants;
   an inner predistorter to predistort the first predistorted signal and generate a second predistorted signal, wherein the inner predistorter uses a second memory model that models power amplifier memory effects within a second range of time constants that is greater than the first range of time constants, and wherein the second predistorted signal is provided as an input to the power amplifier; and
   a first adaptation circuit to adapt the outer predistorter responsive to feedback from the power amplifier.

2. The predistortion system of claim 1, further comprising:
   a second adaptation circuit configured to adapt the inner predistorter responsive to feedback from the power amplifier.

3. The predistortion system of claim 2, wherein the outer predistorter, inner predistorter, first adaptation circuit, and second adaptation circuit are all located within a wireless terminal.

4. The predistortion system of claim 2, wherein each of the outer predistorter, inner predistorter, and first adaptation circuit are located within a wireless terminal, and wherein the second adaptation circuit is external to the wireless terminal.

5. The predistortion system of claim 2, wherein the inner predistorter and second adaptation circuit form an inner predistortion loop, and the outer predistorter and first adaptation circuit form an outer predistortion loop.

6. The predistortion system of claim 1, wherein the first memory model comprises a polynomial-based algorithm.

7. The predistortion system of claim 1, wherein the second memory model comprises a space-mapping adaptation algorithm.

8. The predistortion system of claim 1, wherein the wherein the second memory model is static or quasi-static.

9. A method of compensating for the non-linearity of a power amplifier, comprising:
   predistorting an input signal using an outer predistorter that generates a first predistorted signal, wherein the outer predistorter uses a first memory model that models power amplifier memory effects within a first range of time constants;

predistorting the first predistorted signal using an inner predistorter that generates a second predistorted signal, wherein the inner predistorter uses a second memory model that models power amplifier memory effects within a second range of time constants that is greater than the first range of time constants;

providing the second predistorted signal as an input to a power amplifier; and adapting the outer predistorter via a first adaptation circuit, responsive to feedback from the power amplifier.

10. The method of claim 9, further comprising:
adapting the inner predistorter via a second adaptation circuit, responsive to feedback from the power amplifier.

11. The method of claim 10, wherein said step of adapting the outer predistorter is performed more frequently than said step of adapting the inner predistorter.

12. The method of claim 10, wherein the inner predistorter and second adaptation circuit form an inner predistortion loop, and wherein the outer predistorter and first adaptation circuit form an outer predistortion loop.

13. The method of claim 9, wherein the first memory model comprises a polynomial-based algorithm.

14. The method of claim 9, wherein the second memory model comprises a space-mapping adaptation algorithm.

15. The method of claim 9, wherein the wherein the second memory model is static or quasi-static.

* * * * *